United States Patent
Wang et al.

(10) Patent No.: US 10,510,428 B2
(45) Date of Patent: Dec. 17, 2019

(54) SHIFT REGISTER CIRCUITRY AND DRIVING METHOD THEREOF, GATE DRIVING CIRCUITRY AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jiguo Wang, Beijing (CN); Jun Fan, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/772,410

(22) PCT Filed: Oct. 30, 2017

(86) PCT No.: PCT/CN2017/108391
§ 371 (c)(1),
(2) Date: Apr. 30, 2018

(87) PCT Pub. No.: WO2018/161611
PCT Pub. Date: Sep. 13, 2018

(65) Prior Publication Data
US 2019/0080780 A1    Mar. 14, 2019

(30) Foreign Application Priority Data
Mar. 10, 2017  (CN) .......................... 2017 1 0139980

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2310/08* (2013.01)

(58) Field of Classification Search
CPC .... G11C 19/287; G11C 19/28; G09G 3/3677; G09G 3/20; G09G 2310/0286; G09G 2310/08; G09G 2300/0426
See application file for complete search history.

(56) References Cited

U.S. PATENT DOCUMENTS

| | | | |
|---|---|---|---|
| 9,536,476 B2* | 1/2017 | Cao | G09G 3/3266 |
| 2010/0109738 A1* | 5/2010 | Chien | G09G 3/3677 327/295 |

(Continued)

FOREIGN PATENT DOCUMENTS

| | | |
|---|---|---|
| CN | 102024415 A | 4/2011 |
| CN | 102426817 A | 4/2012 |

(Continued)

OTHER PUBLICATIONS

China Second Office Action, Application No. 201710139980.7, dated Feb. 19, 2019, 16 pps.: with English translation.

(Continued)

*Primary Examiner* — Nitin Patel
*Assistant Examiner* — Amy Onyekaba
(74) *Attorney, Agent, or Firm* — Armstrong Teasdale LLP

(57) ABSTRACT

Embodiments of the present disclosure provide a shift register circuitry and a driving method thereof, a gate driving circuitry, and a display device. The shift register circuitry includes an input circuit and a plurality of output (Continued)

circuits coupled to the input circuit. The input circuit is coupled to an input signal terminal, and is configured to, under the control of the voltage at the input signal terminal, cause the plurality of output circuits to operate. Each of the plurality of output circuits is coupled to a respective clock signal terminal and a respective output signal terminal, and is configured to operate to couple the clock signal terminal to the output signal terminal so as to output a driving signal at the output signal terminal.

19 Claims, 7 Drawing Sheets

(56) References Cited

U.S. PATENT DOCUMENTS

| | | | |
|---|---|---|---|
| 2011/0038201 | A1 | 2/2011 | Takahashi et al. |
| 2014/0118237 | A1* | 5/2014 | Wang ............... G11C 19/28 345/100 |
| 2014/0176410 | A1* | 6/2014 | Ma ................... G09G 3/3622 345/92 |
| 2015/0206490 | A1* | 7/2015 | Lim .................. G09G 3/3677 345/92 |
| 2015/0255031 | A1* | 9/2015 | Cao ................... G09G 3/3648 345/210 |
| 2015/0318052 | A1* | 11/2015 | Li ..................... G11C 19/28 377/64 |
| 2016/0042693 | A1* | 2/2016 | Cao ................... G09G 3/3266 345/212 |
| 2016/0125954 | A1* | 5/2016 | Gu .................... G11C 19/28 377/64 |
| 2017/0039968 | A1* | 2/2017 | Chen ................. G09G 3/3648 |
| 2017/0162148 | A1* | 6/2017 | Xiao ................. G02F 1/1362 |
| 2018/0174553 | A1* | 6/2018 | Bong ................ G09G 3/20 |

FOREIGN PATENT DOCUMENTS

| | | |
|---|---|---|
| CN | 103345941 A | 10/2013 |
| CN | 203325406 U | 12/2013 |
| CN | 104732939 A | 6/2015 |
| CN | 105652537 A | 6/2016 |
| CN | 105788555 A | 7/2016 |
| CN | 105869566 A | 8/2016 |
| CN | 106409207 A | 2/2017 |
| CN | 106652964 A | 5/2017 |

OTHER PUBLICATIONS

PCT International Search Report, Application No. PCT/CN2017/108391, dated Dec. 26, 2017, 7 pages: with English translation.
PCT Written Opinion, Application No. PCT/CN2017/108391, dated Dec. 26, 2017, 7 pages.: with English translation of relevant part.
China First Office Action, Application No. 201710139980.7, dated Sep. 5, 2018, 13 pps.: with English translation.

* cited by examiner

SHIFT REGISTER CIRCUITRY AND DRIVING METHOD THEREOF, GATE DRIVING CIRCUITRY AND DISPLAY DEVICE

CROSS-REFERENCE TO RELATED APPLICATIONS

This patent application is a National Stage Entry of PCT/CN2017/108391 filed on Oct. 30, 2017, which claims the benefit and priority of Chinese Patent Application No. 201710139980.7 filed on Mar. 10, 2017, the disclosures of which are incorporated herein by reference in their entirety as part of the present application.

BACKGROUND

The present disclosure relates to display technology, and in particular, to a shift register circuitry and a driving method thereof, a gate driving circuitry and a display device.

A display panel in a display, such as a liquid crystal display panel, typically includes a pixel matrix that is driven in a line-by-line scanning manner for displaying. A common driving circuit of a thin film transistor liquid crystal display (TFT-LCD) panel includes a gate driver and a data driver. The gate driver includes a shift register that includes a plurality of cascaded shift register circuitries. The output signal terminal of the shift register circuitries are correspondingly connected to gate lines of the pixel matrix, and each gate line is connected to one row of pixels of the pixel matrix. The shift register is driven by a clock signal to output a gate scanning signal in the form of pulse for each gate line in turn, to realize the line-by-line scanning of the pixel matrix.

BRIEF DESCRIPTION

A first aspect of the present disclosure provides a shift register circuitry including an input circuit and a plurality of output circuits coupled to the input circuit. The input circuit is coupled to an input signal terminal and is configured to, under the control of a voltage at the input signal terminal, cause the plurality of output circuits to operate. Each of the plurality of output circuits is coupled to a respective clock signal terminal and a respective output signal terminal, and is configured to operate to couple the clock signal terminal to the output signal terminal so as to output a driving signal at the output signal terminal.

In embodiments of the present disclosure, the shift register circuitry further includes a pull-up point isolation circuit. The pull-up point isolation circuit is coupled to the input circuit and the plurality of output circuits, and is configured such that a conductivity from the input circuit to the plurality of output circuits is unidirectional.

In embodiments of the present disclosure, the shift register circuitry at least further includes a pull-down control circuit, a first pull-down circuit and a second pull-down circuit. The plurality of output circuits include at least a first output circuit and a second output circuit. The input circuit is coupled to the input signal terminal, a first voltage terminal, a first pull-up point, and a second pull-up point, and is configured to couple the first voltage terminal to the first pull-up point and the second pull-up point, under the control of the voltage at the input signal terminal. The first output circuit is coupled to the first clock signal terminal and the first output signal terminal, and is configured to couple the first clock signal terminal to the first output signal terminal, under the control of the voltage at the first pull-up point. The second output circuit is coupled to a second clock signal terminal and a second output signal terminal, and is configured to couple the second clock signal terminal to the second output signal terminal, under the control of the voltage at the second pull-up point. A pull-down control circuit is coupled to a third voltage terminal, a third clock signal terminal, the first pull-up point, the second pull-up point and the pull-down point, and is configured to selectively couple the pull-down point to one of the third voltage terminal and the third clock signal terminal, under the control of voltages at the third clock signal terminal, the first pull-up point and the second pull-up point. The first pull-down circuit is coupled to the pull-down point, the third voltage terminal, the first pull-up point, and the first output signal terminal, and is configured to couple the first pull-up point and the first output signal terminal to the third voltage terminal, under the control of the voltage at the pull-down point. The second pull-down circuit is coupled to the pull-down point, the third voltage terminal, the second pull-up point, and the second output signal terminal, and is configured to couple the second pull-up point and the second output signal terminal to the third voltage terminal, under the control of the voltage at the pull-down point.

In embodiments of the present disclosure, the shift register circuitry further includes a reset circuit. The reset circuit is coupled to a reset signal terminal, the second voltage terminal, and the input circuit, and is configured to couple the input circuit to the second voltage terminal, under the control of the voltage at the reset signal terminal.

In embodiments of the present disclosure, the pull-up point isolation circuit is coupled to the input circuit, the first pull-up point, and the second pull-up point, and is configured such that a conductivity from the input circuit to the first pull-up point and a conductivity from the input circuit to the second pull-up point are unidirectional.

In embodiments of the present disclosure, the pull-up point isolation circuit includes a first transistor and a second transistor. The control electrode and the first electrode of the first transistor are coupled to the input circuit, and the second electrode of the first transistor is coupled to the first pull-up point. The control electrode and the first electrode of the second transistor are coupled to the input circuit, and the second electrode of the second transistor is coupled to the second pull-up point.

In embodiments of the present disclosure, the pull-down control circuit is further coupled to the first output signal terminal and the second output signal terminal, and is configured to selectively couple the pull-down point to one of the third voltage terminal and the third clock signal terminal, under the control of voltages at the third clock signal terminal, the first pull-up point, the second pull-up point, the first output signal terminal, and the second output signal terminal.

In embodiments of the present disclosure, the pull-down control circuit includes a third transistor, a fourth transistor, a fifth transistor, a sixth transistor, and a seventh transistor. The control electrode and the first electrode of the third transistor are coupled to the third clock signal terminal, and the second electrode of the third transistor is coupled to the pull-down point. The control electrode of the fourth transistor is coupled to the first pull-up point, the first electrode of the fourth transistor is coupled to the pull-down point, and the second electrode of the fourth transistor is coupled to the third voltage terminal. The control electrode of the fifth transistor is coupled to the first output signal terminal, the first electrode of the fifth transistor is coupled to the pull-down point, and the second electrode of the fifth transistor is coupled to the third voltage terminal. The control electrode of the sixth transistor is coupled to the second pull-up point, the first electrode of the sixth transistor is coupled to the pull-down point, and the second electrode of the sixth transistor is coupled to the third voltage terminal. The control electrode of the seventh transistor is coupled to the second output signal terminal, the first electrode of the seventh transistor is coupled to the pull-down point, and the second electrode of the seventh transistor is coupled to the third voltage terminal.

In embodiments of the present disclosure, the input circuit includes an eighth transistor. The control electrode of the eighth transistor is coupled to the input signal terminal, the first electrode of the eighth transistor is coupled to the first voltage terminal, and the second electrode of the eighth transistor is coupled to the first pull-up point and the second pull-up point.

In embodiments of the present disclosure, the reset circuit includes a ninth transistor. The control electrode of the ninth transistor is coupled to the reset signal terminal, the first electrode of the ninth transistor is coupled to the input circuit, and the second electrode of the ninth transistor is coupled to the second voltage terminal.

In embodiments of the present disclosure, the first output circuit includes a tenth transistor and a first capacitor. The control electrode of the tenth transistor is coupled to the first pull-up point, the first electrode of the tenth transistor is coupled to the first clock signal terminal, and the second electrode of the tenth transistor is coupled to the first output signal terminal. The first capacitor is coupled between the control electrode and the second electrode of the tenth transistor.

In embodiments of the present disclosure, the second output circuit includes an eleventh transistor and a second capacitor. The control electrode of the eleventh transistor is coupled to the second pull-up point, the first electrode of the eleventh transistor is coupled to the second clock signal terminal, and the second electrode of the eleventh transistor is coupled to the second output signal terminal. The second capacitor is coupled between the control electrode and the second electrode of the eleventh transistor.

In embodiments of the present disclosure, the first pull-down circuit includes a twelfth transistor, a thirteenth transistor, and a third capacitor. The control electrode of the twelfth transistor is connected to the pull-down point, the first electrode of the twelfth transistor is connected to the first pull-up point, and the second electrode of the twelfth transistor is connected to the third voltage terminal. The control electrode of the thirteenth transistor is connected to the pull-down point, the first electrode of the thirteenth transistor is connected to the first output signal terminal, and the second electrode of the thirteenth transistor is connected to the third voltage terminal. The third capacitor is coupled between the pull-down point and the third voltage terminal.

In embodiments of the present disclosure, the second pull-down circuit includes a fourteenth transistor and a fifteenth transistor. The control electrode of the fourteenth transistor is connected to the pull-down point, the first electrode of the fourteenth transistor is connected to the second pull-up point, and the second electrode of the fourteenth transistor is connected to the third voltage terminal. The control electrode of the fifteenth transistor is connected to the pull-down point, the first electrode of the fifteenth transistor is connected to the second output signal terminal, and the second electrode of the fifteenth transistor is connected to the third voltage terminal.

A second aspect of the present disclosure provides a driving method for driving the above shift register circuitry. The method includes applying a valid voltage to an input signal terminal such that a plurality of output circuits are in operation, and applying a valid voltage to a clock signal terminal, such that each of the plurality of output circuits outputs a driving signal.

In embodiments of the present disclosure, the shift register circuitry driven by the driving method at least further includes a pull-down control circuit, a first pull-down circuit, and a second pull-down circuit. The plurality of output circuits include at least a first output circuit and a second output circuit. The input circuit is coupled to the input signal terminal, a first voltage terminal, a first pull-up point, and a second pull-up point. The first output circuit is coupled to a first clock signal terminal and a first output signal terminal. The second output circuit is coupled to a second clock signal terminal and a second output signal terminal. The pull-down control circuit is coupled to a third voltage terminal, a third clock signal terminal, the first pull-up point, the second pull-up point, and a pull-down point. The first pull-down circuit is coupled to the pull-down point, the third voltage terminal, the first pull-up point, and the first output signal terminal. The second pull-down circuit is coupled to the pull-down point, the third voltage terminal, the second pull-up point, and the second output signal terminal. In the driving method for driving the shift register circuitry, applying a valid voltage to an input signal terminal such that the plurality of output circuits are in operation includes applying a valid voltage to the input signal terminal, and applying an invalid voltage to the first clock signal terminal, the second clock signal terminal, the third clock signal terminal, and a reset signal terminal, such that the input circuit couples the first voltage terminal to the first pull-up point and the second pull-up point, voltages at the first pull-up point and the second pull-up point are valid, the first output circuit couples the first clock signal terminal to the first output signal terminal, the first output signal terminal outputs an invalid voltage, the second output circuit couples the second clock signal terminal to the second output signal terminal, the second output signal terminal outputs an invalid voltage. Applying a valid voltage to the clock signal terminal such that each of the plurality of output circuits outputs a driving signal includes applying a valid voltage to the first clock signal terminal, and applying an invalid voltage to the input signal terminal, the second clock signal terminal, the third clock signal terminal, and the reset signal terminal, such that voltages at the first pull-up point and the second pull-up point are valid, the first output circuit couples the first clock signal terminal to the first output signal terminal, the first output signal terminal outputs a valid voltage, the second output circuit couples the second clock signal terminal to the second output signal terminal, and the second output signal terminal outputs an invalid voltage. Applying a valid voltage to the clock signal terminal such that each of the plurality of output circuits outputs a driving signal further includes applying a valid voltage to the second clock signal terminal, and applying an invalid voltage to the input signal terminal, the first clock signal terminal, the third clock signal terminal, and the reset signal terminal, such that voltages at the first pull-up point and the second pull-up point are valid, the first output circuit couples the first clock signal terminal to the first output signal terminal, the first output signal terminal outputs an invalid voltage, the second output circuit couples the second clock signal terminal to the second output signal terminal, and the second output signal terminal outputting a valid voltage.

The shift register circuitry at least further includes a reset circuit. The reset circuit is coupled to the reset signal terminal, the second voltage terminal and the input circuit. The driving method for driving the shift register circuitry further includes applying a valid voltage to the third clock signal terminal and the reset signal terminal, and applying an invalid voltage to the input signal terminal, the first clock signal terminal, and the second clock signal terminal, such that the voltage at the pull-down point is valid, the pull-down circuit couples the third voltage terminal to the first pull-up point, the second pull-up point, the first output signal terminal, and the second output signal terminal, the first output signal terminal outputs an invalid voltage, and the second output signal terminal outputs an invalid voltage.

A third aspect of the present disclosure provides a gate driving circuitry including a plurality of cascaded shift register circuitries of any one of the foregoing. One output signal terminal of a shift register circuitry of one stage is coupled to the input signal terminal of the shift register circuitry of the next stage.

In embodiments of the present disclosure, the shift register circuitry further includes a pull-up point isolation circuit. The pull-up point isolation circuit is coupled to the input circuit and the plurality of output circuits, and is configured such that a conductivity from the input circuit to the plurality of output circuits is unidirectional.

In embodiments of the present disclosure, the shift register circuitry further includes a reset circuit, a pull-down control circuit, a first pull-down circuit, and a second pull-down circuit. The plurality of output circuits include a first output circuit and a second output circuit. The input circuit is coupled to the input signal terminal, the first voltage terminal, the first pull-up point, and the second pull-up point. The first output circuit is coupled to the first clock signal terminal and the first output signal terminal. The second output circuit is coupled to the second clock signal terminal and the second output signal terminal. The reset circuit is coupled to the reset signal terminal, the second voltage terminal, and the input circuit. The pull-down control circuit is coupled to the third voltage terminal, the third clock signal terminal, the first pull-up point, the second pull-up point and the pull-down point. The first pull-down circuit is coupled to the pull-down point, the third voltage terminal, the first pull-up point and the first output signal terminal. The second pull-down circuit is coupled to the pull-down point, the third voltage terminal, the second pull-up point and the second output signal terminal. The second output signal terminal of a shift register circuitry of one stage is coupled to the input signal terminal of the shift register circuitry of the next stage, and the first output signal terminal of a shift register circuitry of one stage is coupled to the reset signal terminal of the shift register circuitry of the previous stage.

A fourth aspect of the present disclosure provide provides a display device including the gate driving circuitry described above.

The shift register circuitry, the driving method thereof, the gate driving circuitry, and the display device provided according to the embodiments of the present disclosure, increase the driving ability of the driving circuit.

BRIEF DESCRIPTION OF THE DRAWINGS

To describe the technical solutions in the embodiments of the present disclosure more clearly, the accompanying drawings of the embodiments will be briefly described below. It should be appreciated that the accompanying drawings described below relate to only some embodiments of the present disclosure, rather than limiting the present disclosure, wherein.

DETAILED DESCRIPTION

In order to make the technical solutions and advantages of the embodiments of the disclosure clearer, the technical solutions in the embodiments of the disclosure will be clearly and completely described below in conjunction with the accompanying drawings. Apparently, the described embodiments are part, instead of all, of the embodiments of the disclosure. All other embodiments obtained by those skilled in the art based on the described embodiments of the disclosure without the need for creative work also fall within the scope of the disclosure sought for protection.

Figure 1:
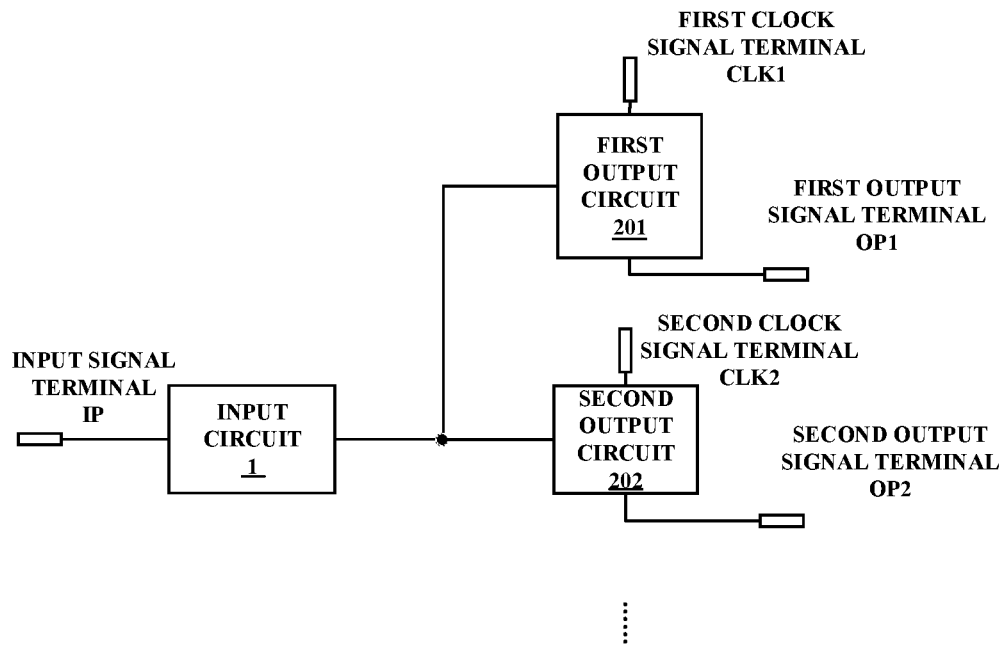
FIG. 1 is a first exemplary block diagram of a shift register circuitry provided by embodiments of the present disclosure.

FIG. 1 is a first exemplary block diagram of a shift register circuitry provided by embodiments of the present disclosure. As shown in FIG. 1, the shift register circuitry includes an input circuit 1 and a plurality of output circuits 201, 202 . . . coupled to the input circuit 1. The input circuit 1 is coupled to the input signal terminal IP, and is configured to, under the control of the voltage at the input signal terminal IP, cause the plurality of output circuits 201, 202, . . . to operate. Each of the plurality of output circuits 201, 202, . . . is coupled to a corresponding one of the clock signal terminals CLK1, CLK2, . . . , and a corresponding one of the output signal terminals OP1, OP2, . . . , and is configured to operate to couple a corresponding one of the clock signal terminals CLK1, CLK2, . . . to a corresponding one of the output signal terminals OP1, OP2, . . . , so as to output a driving signal at a corresponding one of the output signal terminals OP1, OP2, . . . .

Referring to the structure shown in FIG. 1, it is easy to expand the output circuits of the shift register circuitry to a desired number and configure the desired clock signal terminals accordingly.

In embodiments of the present disclosure, the driving method of the above-mentioned shift register circuitry may include applying a valid voltage to the input signal terminal such that the plurality of output circuits are in operation, and applying a valid voltage to the clock signal terminal, such that each of the plurality of output circuits outputs a driving signal.

In embodiments of the present disclosure, one shift register circuitry may output a plurality of driving signals. Moreover, the plurality of driving signals may be sequentially outputted, and thus, may be used for the driving of pixels of a plurality of adjacent rows.

Figure 2:
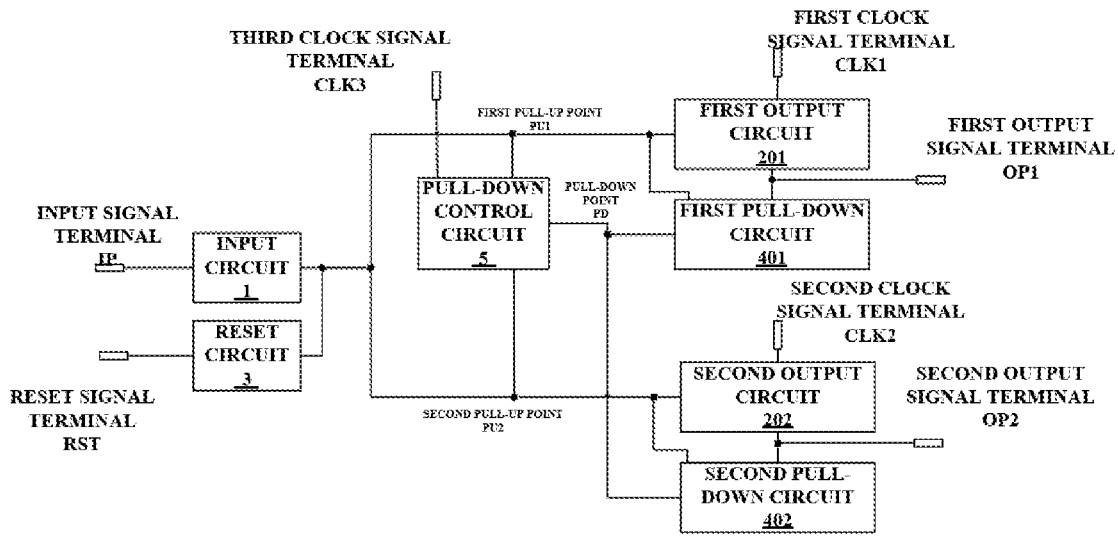
FIG. 2 is a second exemplary block diagram of a shift register circuitry provided by embodiments of the present disclosure.

FIG. 2 is a second exemplary block diagram of a shift register circuitry provided by embodiments of the present disclosure. As shown in FIG. 2, the shift register circuitry provided in this embodiment includes an input circuit 1, a first output circuit 201, a second output circuit 202, a reset circuit 3, a first pull-down circuit 401, a second pull-down circuit 402, and a pull-down control circuit 5. The input circuit 1 is coupled to the input signal terminal IP, a first voltage terminal V1, a first pull-up point PU1, and a second pull-up point PU2, and is configured to couple the first voltage terminal V1 to the first pull-up point PU1 and the second pull-up point PU2, under the control of the voltage at the input signal terminal IP. The first output circuit 201 is coupled to a first clock signal terminal CLK1 and a first output signal terminal OP1, and is configured to couple the first clock signal terminal CLK1 to the first output signal terminal OP1, under the control of the voltage at the first pull-up point PU1. The second output circuit 202 is coupled to a second clock signal terminal CLK2 and a second output signal terminal OP2, and is configured to couple the second clock signal terminal CLK2 to the second output signal terminal OP2, under the control of the voltage at the second pull-up point PU2. The reset circuit 3 is coupled to a reset signal terminal RST, a second voltage terminal V2, and the input circuit 1, and is configured to couple the input circuit 1 to the second voltage terminal V2, under the control of the voltage at the reset signal terminal RST. The pull-down control circuit 5 is coupled to the third voltage terminal V3, the third clock signal terminal CLK3, the first pull-up point PU1, the second pull-up point PU2 and the pull-down point PD, and is configured to selectively couple the pull-down point PD to one of the third voltage terminal V3 and the third clock signal terminal CLK3, under the control of voltages at the third clock signal terminal CLK3, the first pull-up point PU1 and the second pull-up point PU2. The first pull-down circuit 401 is coupled to the pull-down point PD, the third voltage terminal V3, the first pull-up point PU1 and the first output signal terminal OP1, and is configured to couple the first pull-up point PU1 and the first output signal terminal OP1 to the third voltage terminal V3, under the control of the voltage at the pull-down point PD. The second pull-down circuit 402 is coupled to the pull-down point PD, the third voltage terminal V3, the second pull-up point PU2 and the second output signal terminal, and is configured to couple the second pull-up point PU2 and the second output signal terminal OP2 to the third voltage terminal V3, under the control of the voltage at the pull-down point PD.

The shift register circuitry according to the embodiment of the present disclosure can output two driving signals and increase the driving ability of the driving circuit. In addition, as commonly understood by those skilled in the art, coupling refers to a direct or indirect electrical connection.

Based on this embodiment and the accompanying drawings, those skilled in the art can easily design a corresponding shift register circuitry such that it can output multiple driving signals.

Figure 3:
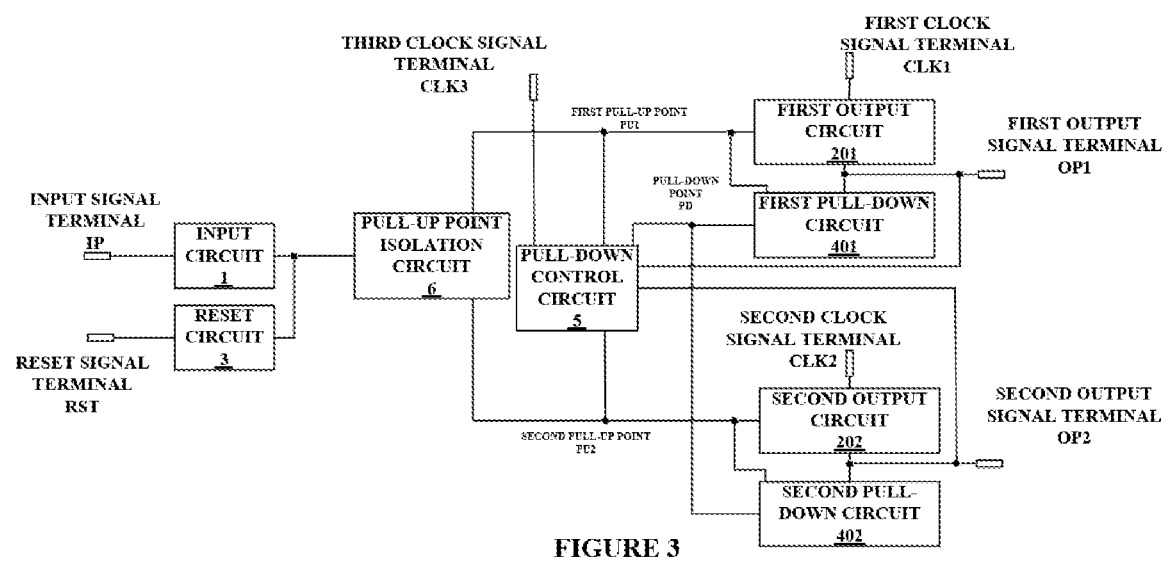
FIG. 3 is a third exemplary block diagram of a shift register circuitry provided by embodiments of the present disclosure.

FIG. 3 is a third exemplary block diagram of a shift register circuitry provided by embodiments of the present disclosure. As shown in FIG. 3, the shift register circuitry further includes a pull-up point isolation circuit 6. The pull-up point isolation circuit 6 is coupled to the input circuit 1, the first pull-up point PU1, and the second pull-up point PU2, and is configured such that the conductivity from the input circuit 1 to the first pull-up point PU1 and the connection from the input circuits 1 to the second pull-up point PU2 are unidirectional.

The shift register circuitry according to the embodiment of the present disclosure can isolate the first pull-up point PU1 and the second pull-up point PU2, preventing mutual influences between the two output signals, and enhancing the anti-noise ability.

In addition, the pull-down control circuit 5 is further coupled to the first output signal terminal OP1 and the second output signal terminal OP2, and is configured to selectively couple the pull-down point PD to one of the third voltage terminal V3 and the third clock signal terminal CLK3, under the control of the voltage at the third clock signal terminal CLK3, the first pull-up point PU1, the second pull-up point PU2, the first output signal terminal OP1, and the second output signal terminal OP2.

The shift register circuitry according to the embodiment of the present disclosure can control the pull-down point PD by feeding back the voltages at the first output signal terminal OP1, the second output signal terminal OP2, the first pull-up point PU1, and the second pull-up point PU2, and moreover, can also control the voltage at the first output signal terminal OP1, the second output signal terminal OP2, the first pull-up point PU1, and the second pull-up point PU2 by changing the voltage at the pull-down point PD, to enhance the anti-noise ability and make the output smoother.

Figure 4:
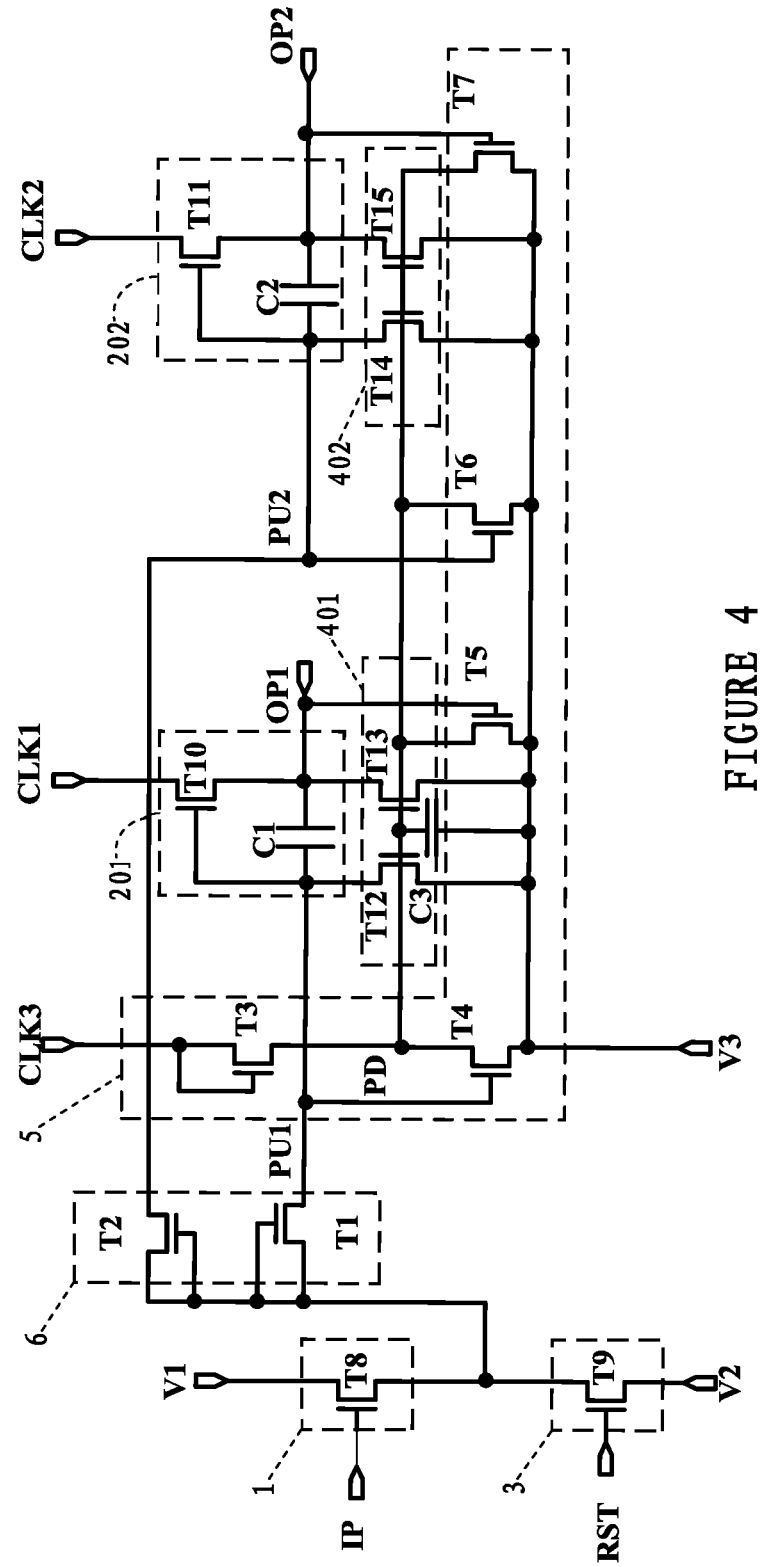
FIG. 4 is an exemplary circuit diagram of the shift register circuitry shown in FIG. 3.

FIG. 4 is an exemplary circuit diagram of the shift register circuitry shown in FIG. 3. As shown in FIG. 4, the pull-up point isolation circuit 6 includes a first transistor T1 and a second transistor T2. The control electrode and the first electrode of the first transistor T1 are coupled to the input circuit 1, and the second electrode of the first transistor T1 is coupled to the first pull-up point PU1. The control electrode and the first electrode of the second transistor T2 are coupled to the input circuit 1, and the second electrode of the second transistor T2 is coupled to the second pull-up point PU2.

In embodiments of the present disclosure, the manner of connecting the first transistor T1 and the second transistor T2 forms a unidirectional conductive structure similar to a diode, and plays the role of isolation. The implementation of transistors facilitates the fabrication of integrated circuits, but it should be understood that this is not intended to be a limitation of the present disclosure, and other elements or circuits having a unidirectional conductive function may be used.

The pull-down control circuit 5 includes a third transistor T3, a fourth transistor T4, a fifth transistor T5, a sixth transistor T6, and a seventh transistor T7. The control electrode and the first electrode of the third transistor T3 are coupled to the third clock signal terminal CLK3, and the second electrode of the third transistor T3 is coupled to the pull-down point PD. The control electrode of the fourth transistor T4 is coupled to the first pull-up point PU1, the first electrode of the fourth transistor T4 is coupled to the pull-down point PD, and the second electrode of the fourth transistor T4 is coupled to the third voltage terminal V3. The control electrode of the fifth transistor T5 is coupled to the first output signal terminal OP1, the first electrode of the fifth transistor T5 is coupled to the pull-down point PD, and the second electrode of the fifth transistor T5 is coupled to the third voltage terminal V3. The control electrode of the sixth transistor T6 is coupled to the second pull-up point PU2, the first electrode of the sixth transistor T6 is coupled to the pull-down point PD, and the second electrode of the sixth transistor T6 is coupled to the third voltage terminal V3. The control electrode of the seventh transistor T7 is coupled to the second output signal terminal OP2, the first electrode of the seventh transistor T7 is coupled to the pull-down point PD, and the second electrode of the seventh transistor T7 is coupled to the third voltage terminal V3.

In embodiments of the present disclosure, the fourth transistor T4, the fifth transistor T5, the sixth transistor T6, and the seventh transistor T7 are used to feed back the voltages at the first pull-up point PU1, the second pull-up point PU2, the first output signal terminal OP1, and the second output signal terminal OP2 to control the voltage at the pull-down point PD, to enhance the anti-noise ability and make the output smoother.

In the following, an implementation of other circuits will also be described as an example.

The input circuit 1 includes an eighth transistor T8. The control electrode of the eighth transistor T8 is coupled to the input signal terminal IP, the first electrode of the eighth transistor T8 is coupled to the first voltage terminal V1, and the second electrode of the eighth transistor T8 is coupled to the first pull-up point PU1 and the second pull-up point PU2.

The reset circuit 3 includes a ninth transistor T9. The control electrode of the ninth transistor T9 is coupled to the reset signal terminal RST, the first electrode of the ninth transistor T9 is coupled to the input circuit 1, and the second electrode of the ninth transistor T9 is coupled to the second voltage terminal V2.

The first output circuit 201 includes a tenth transistor T10 and a first capacitor C1. The control electrode of the tenth transistor T10 is coupled to the first pull-up point PU1, the first electrode of the tenth transistor T10 is coupled to the first clock signal terminal CLK1, and the second electrode of the tenth transistor T10 is coupled to the first output signal terminal OP1. The first capacitor C1 is coupled between the control electrode and the second electrode of the tenth transistor T10.

The second output circuit 202 includes an eleventh transistor T11 and a second capacitor C2. The control electrode of the eleventh transistor T11 is coupled to the second pull-up point PU2, the first electrode of the eleventh transistor T11 is coupled to the second clock signal terminal CLK2, and the second electrode of the eleventh transistor T11 is coupled to the second output signal terminal OP2. The second capacitor C2 is coupled between the control electrode and the second electrode of the eleventh transistor T11.

The first pull-down circuit 401 includes a twelfth transistor T12, a thirteenth transistor T13, and a third capacitor C3. The control electrode of the twelfth transistor T12 is connected to the pull-down point PD, the first electrode of the twelfth transistor T12 is connected to the first pull-up point PU1, and the second electrode of the twelfth transistor T12 is connected to the third voltage terminal V3. The control electrode of the thirteenth transistor T13 is connected to the pull-down point PD, the first electrode of the thirteenth transistor T13 is connected to the first output signal terminal OP1, and the second electrode of the thirteenth transistor T13 is connected to the third voltage terminal V3. The third capacitor C3 is coupled between the pull-down point PD and the third voltage terminal V3.

The second pull-down circuit 402 includes a fourteenth transistor T14 and a fifteenth transistor T15. The control electrode of the fourteenth transistor T14 is connected to the pull-down point PD, the first electrode of the fourteenth transistor T14 is connected to the second pull-up point PU2, and the second electrode of the fourteenth transistor T14 is connected to the third voltage terminal V3. The control electrode of the fifteenth transistor T15 is connected to the pull-down point PD, the first electrode of the fifteenth transistor T15 is connected to the second output signal terminal OP2, and the second electrode of the fifteenth transistor T15 is connected to the third voltage terminal V3.

Figure 5:
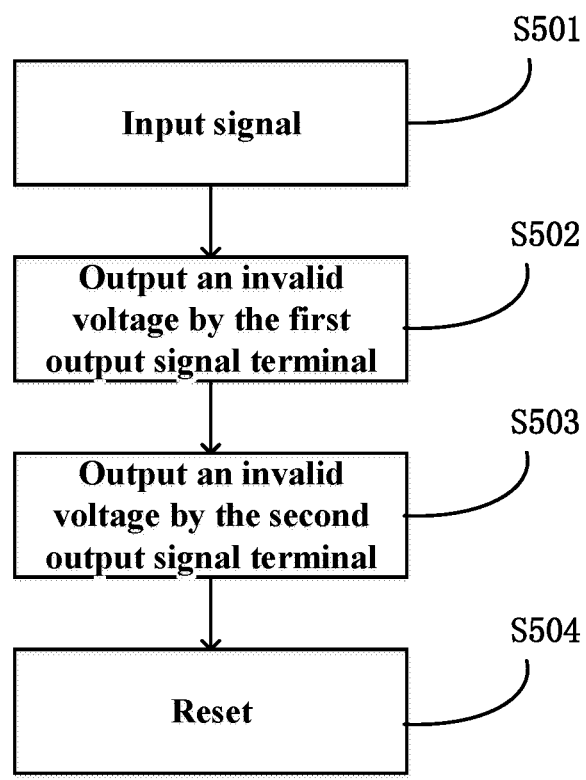
FIG. 5 is an exemplary flowchart of a driving method of a shift register circuitry provided by embodiments of the present disclosure.
Figure 6:
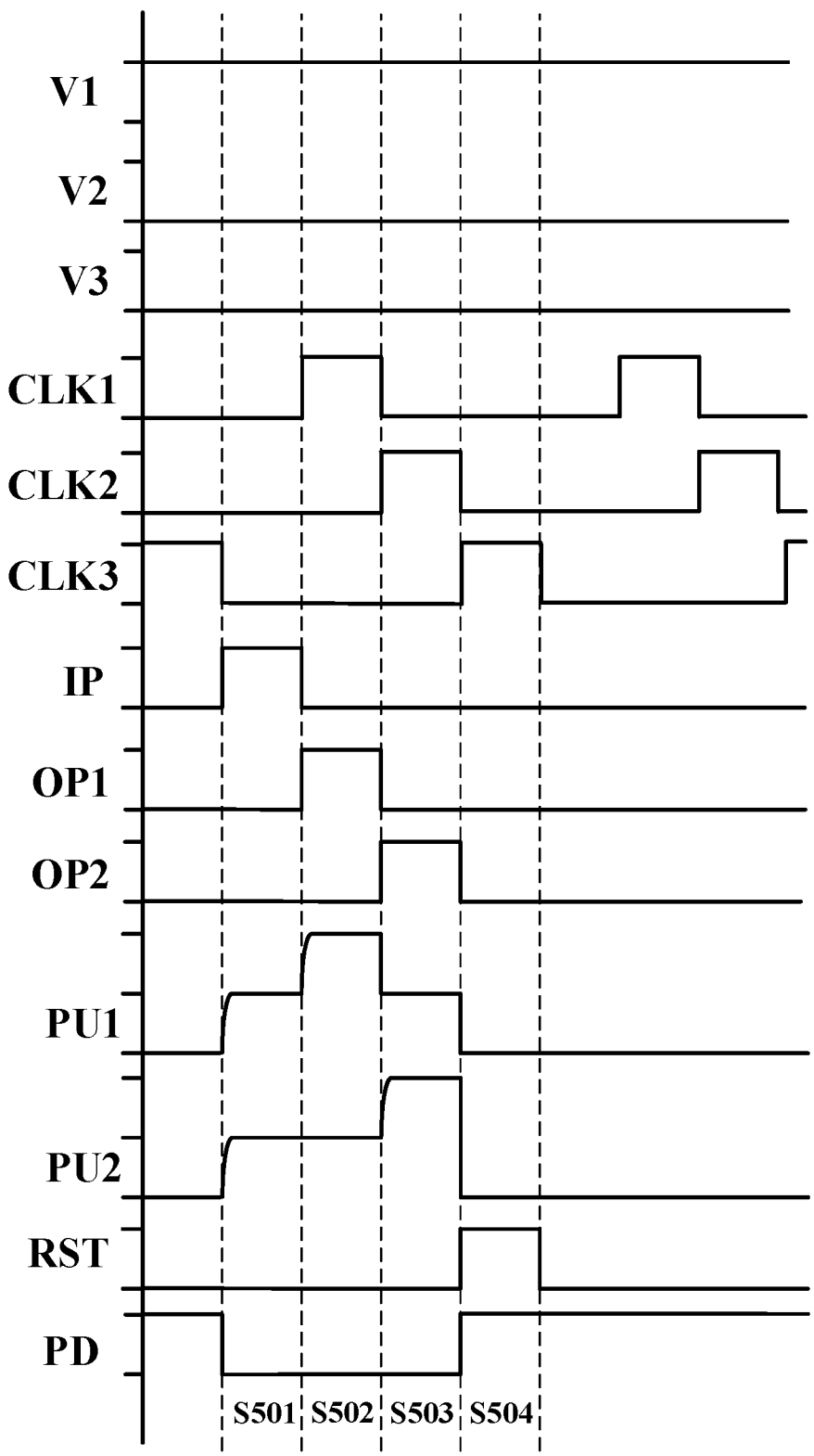
FIG. 6 is an exemplary operational timing diagram corresponding to the driving method shown in FIG. 5.

FIG. 5 is an exemplary flowchart of a driving method of a shift register circuitry provided by embodiments of the present disclosure. FIG. 6 is an exemplary operational timing diagram corresponding to the driving method shown in FIG. 5. Hereinafter, the driving method and the operation timing of the shift register circuitry will be described with reference to FIGS. 4, 5, and 6, and the description will be given by example of the transistors in FIG. 4 being all N-type transistors and the valid voltage being a high voltage. Wherein as commonly understood by those skilled in the art, the valid voltage refers to a voltage capable of causing the associated circuits to operate, and the high voltage herein may turn on the N-type transistors. It should be understood that the "high voltage" herein is only used for representing the function of the voltage and does not limit the amplitude thereof. For example, a "high voltage" may be 3.3V, 5V or the like. In addition, in the case of P-type transistors, the valid voltage is a low voltage, and the "low voltage" can be 0V, −3.3V, −5V and so on.

As shown in FIG. 5, the driving method starts with step S501, which may be referred to as a signal inputting step. In step S501, a valid voltage is applied to the input signal terminal IP, such that the plurality of output circuits are in operation. In step S501, a valid voltage is applied to the input signal terminal IP, and an invalid voltage is applied to the first clock signal terminal CLK1, the second clock signal terminal CLK2, the third clock signal terminal CLK3, and the reset signal terminal RST. The input circuit 1 couples the first voltage terminal V1 to the first pull-up point PU1 and the second pull-up point PU2 such that the voltage at the first pull-up point PU1 and the second pull-up point PU2 is valid. The first output circuit 201 couples the first clock signal terminal CLK1 to the first output signal terminal OP1, and the first output signal terminal OP1 outputs an invalid voltage. The second output circuit 202 couples the second clock signal terminal CLK2 to the second output signal terminal OP2, and the second output signal terminal OP2 output an invalid voltage.

As shown in FIG. 6, specifically, a high voltage is applied to the input signal terminal IP, and a low voltage is applied to the first clock signal terminal CLK1, the second clock signal terminal CLK2, the third clock signal terminal CLK3, and the reset signal terminal RST. The eighth transistor T8, the first transistor T1, and the second transistor T2 are turned on, such that the first voltage terminal V1 is coupled to the first pull-up point PU1 and the second pull-up point PU2. The voltage at the first voltage terminal V1 is high, such that the voltage at the first pull-up point PU1 and the second pull-up point PU2 is high. The tenth transistor T10 and the eleventh transistor T11 are turned on such that the first output signal terminal OP1 is coupled to the first clock signal terminal CLK1 and the second output signal terminal OP2 is coupled to the second clock signal terminal CLK2. The voltage at the first clock signal terminal CLK1 and the second clock signal terminal CLK2 is low, such that the voltage at the first output signal terminal OP1 and the second output signal terminal OP2 is low.

It should be understood that the input circuit 1 and the reset circuit 3 are symmetrical. If a low voltage is provided at the first voltage terminal V1, a high voltage is provided at the second voltage terminal V2, and in step S501, a high voltage is applied to the reset signal terminal RST, such that the second voltage terminal V2 is coupled to the first pull-up point PU1 and the second pull-up point PU2, and also at the first pull-up point PU1 and the second pull-up point PU2 may be a high voltage. Such manner can be called reverse scanning. That is, the structure of the shift register circuitry of the present disclosure can realize forward and reverse scanning.

Then, proceed to step S502, which may be referred to as a first output signal outputting step. In step S502, a valid voltage is applied to the first clock signal terminal CLK1, and an invalid voltage is applied to the input signal terminal IP, the second clock signal terminal CLK2, the third clock signal terminal CLK3, and the reset signal terminal RST. The voltage at the first pull-up point PU1 and the second pull-up point PU2 is valid. The first output circuit 201 couples the first clock signal terminal CLK1 to the first output signal terminal OP1, and the first output signal terminal OP1 outputs a valid voltage. The second output circuit 20 couples the second clock signal terminal CLK2 to the second output signal terminal OP2, and the second output signal terminal OP2 outputs an invalid voltage.

As shown in FIG. 6, specifically, a high voltage is applied to the first clock signal terminal CLK1, and a low voltage is applied to the input signal terminal IP, the second clock signal terminal CLK2, the third clock signal terminal CLK3 and the reset signal terminal RST. The eighth transistor T8, the first transistor T1, and the second transistor T2 are turned off, such that the first voltage terminal V1 is decoupled from the first pull-up point PU1 and the second pull-up point PU2. A high voltage is maintained at the first pull-up point PU1 and the second pull-up point PU2. The tenth transistor T10 and the eleventh transistor T11 maintain ON, such that the first output signal terminal OP1 is coupled to the first clock signal terminal CLK1 and the second output signal terminal OP2 is coupled to the second clock signal terminal CLK2. The voltage at the first clock signal terminal CLK1 is high, such that the voltage at the first output signal terminal OP1 is high. Moreover, after the voltage at the first output signal terminal OP1 rises, the voltage at the first pull-up point PU1 further rises due to the bootstrap effect of the first capacitor C1, which enables the tenth transistor T10 to be steadily turned on, ensuring the smoothness of the output. The voltage at the second clock signal terminal CLK2 is low such that the voltage at the second output signal terminal OP2 is low.

Then, proceed to step S503, which may be referred to as a second output signal outputting step. In step S503, a valid voltage is applied to the second clock signal terminal CLK2, and an invalid voltage is applied to the input signal terminal IP, the first clock signal terminal CLK1, the third clock signal terminal CLK3, and the reset signal terminal RST. The voltages at the first pull-up point PU1 and the second pull-up point PU2 are valid. The first output circuit 201 couples the first clock signal terminal CLK1 to the first output signal terminal OP1, and the first output signal terminal OP1 outputs an invalid voltage. The second output circuit 202 couples the second clock signal terminal CLK2 to the second output signal terminal OP2, and the second output signal terminal OP2 outputs a valid voltage.

As shown in FIG. 6, specifically, a high voltage is applied to the second clock signal terminal CLK2, and a low voltage is applied to the input signal terminal IP, the first clock signal terminal CLK1, the third clock signal terminal CLK3, and the reset signal terminal RST. The eighth transistor T8, the first transistor T1, and the second transistor T2 are turned off, such that the first voltage terminal V1 is decoupled from the first pull-up point PU1 and the second pull-up point PU2. A high voltage is maintained at the first pull-up point PU1 and the second pull-up point PU2. The tenth transistor T10 and the eleventh transistor T11 maintain ON, such that the first output signal terminal OP1 is coupled to the first clock signal terminal CLK1 and the second output signal terminal OP2 is coupled to the second clock signal terminal CLK2. The voltage at the first clock signal terminal CLK1 is low, such that the voltage at the first output signal terminal OP1 is low. The voltage at the second clock signal terminal CLK2 is high, such that the voltage at the second output signal terminal OP2 is high. Moreover, after the voltage at the second output signal terminal OP2 rises, the voltage at the second pull-up point PU2 further rises due to the bootstrap effect of the second capacitor C2, which enables the eleventh transistor T11 to be steadily turned on, ensuring the smoothness of the output.

Through steps S502 and S503, a valid voltage is applied to the clock signal terminal such that each of the plurality of output circuits outputs a driving signal.

Finally, proceed to step S504, which may be referred to as a resetting step. In step S504, a valid voltage is applied to the third clock signal terminal CLK3 and the reset signal terminal RST, and an invalid voltage is applied to the input signal terminal IP, the first clock signal terminal CLK1, and the second clock signal terminal CLK2. The voltage at the pull-down point PD is valid. The pull-down circuit couples the third voltage terminal V3 to the first pull-up point PU1, the second pull-up point PU2, the first output signal terminal OP1, and the second output signal terminal OP2. The first output signal terminal OP1 outputs an invalid voltage, and the second output signal terminal OP2 outputs an invalid voltage.

As shown in FIG. 6, specifically, a high voltage is applied to the third clock signal terminal CLK3, and a low voltage is applied to the input signal terminal IP, the first clock signal terminal CLK1, the second clock signal terminal CLK2, and the reset signal terminal RST. The eighth transistor T8, the first transistor T1, and the second transistor T2 are turned off, such that the first voltage terminal V1 is decoupled from the first pull-up point PU1 and the second pull-up point PU2. The third transistor T3 is turned on, such that the third clock terminal is coupled to the pull-down point PD, and the voltage at the pull-down point PD is high. The high voltage at the pull-down point PD causes the twelfth transistor T12, the thirteenth transistor T13, the fourteenth transistor T14, and the fifteenth transistor T15 to be turned on, and the third voltage terminal V3 is coupled to the first pull-up point PU1, the second pull-up point PU2, the first output signal terminal OP1, and the second output signal terminal OP2. The voltage at the first pull-up point PU1, the second pull-up point PU2, the first output signal terminal OP1, and the second output signal terminal OP2 is low, and the tenth transistor T10 and the eleventh transistor T11 are turned off. The third capacitor C3 maintains the voltage at the pull-down point PD.

According to embodiments of the present disclosure, two driving signals can be outputted, increasing the driving ability of the driving circuit. The first pull-up point PU1 can be isolated from the second pull-up point PU2, so as to prevent the two output signals from interfering with each other and enhance the anti-noise ability. The pull-down point PD can be controlled by feeding back the voltage at the first output signal terminal OP1, the second output signal terminal OP2, the first pull-up point PU1, and the second pull-up point PU2, and also voltages at the first output signal terminal OP1, the second output signal terminal OP2, the first pull-up point PU1, and the second pull-up point PU2 can be controlled by changing the voltage at the pull-down point PD, which enhances the anti-noise ability and makes the output smoother.

Figure 7:
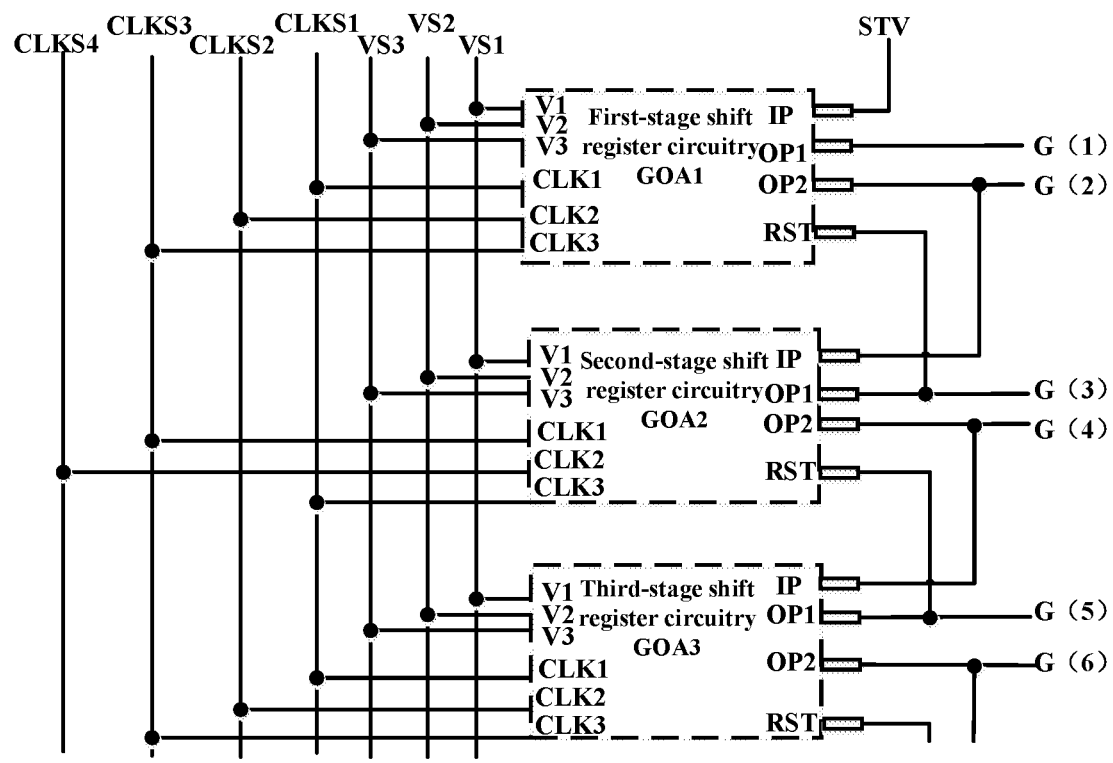
FIG. 7 is an exemplary block diagram of a gate driving circuitry provided by embodiments of the present disclosure.

FIG. 7 is an exemplary block diagram of a gate driving circuitry provided by embodiments of the present disclosure. As shown in FIG. 7, the gate driving circuitry includes a plurality of cascaded shift register circuitries described above. FIG. 7 shows the shift register circuitries of the first three stages, with the repeated structure following thereafter omitted. For a shift register circuitry of one stage (e.g., the second stage), the second output signal terminal OP2 thereof is coupled to the input signal terminal IP of the shift register circuitry of the next stage (the third stage). Moreover, the first output signal terminal OP1 of the shift register circuitry of that stage is coupled to the reset signal terminal RST of the shift register circuitry of the previous stage (the first stage).

Figure 8:
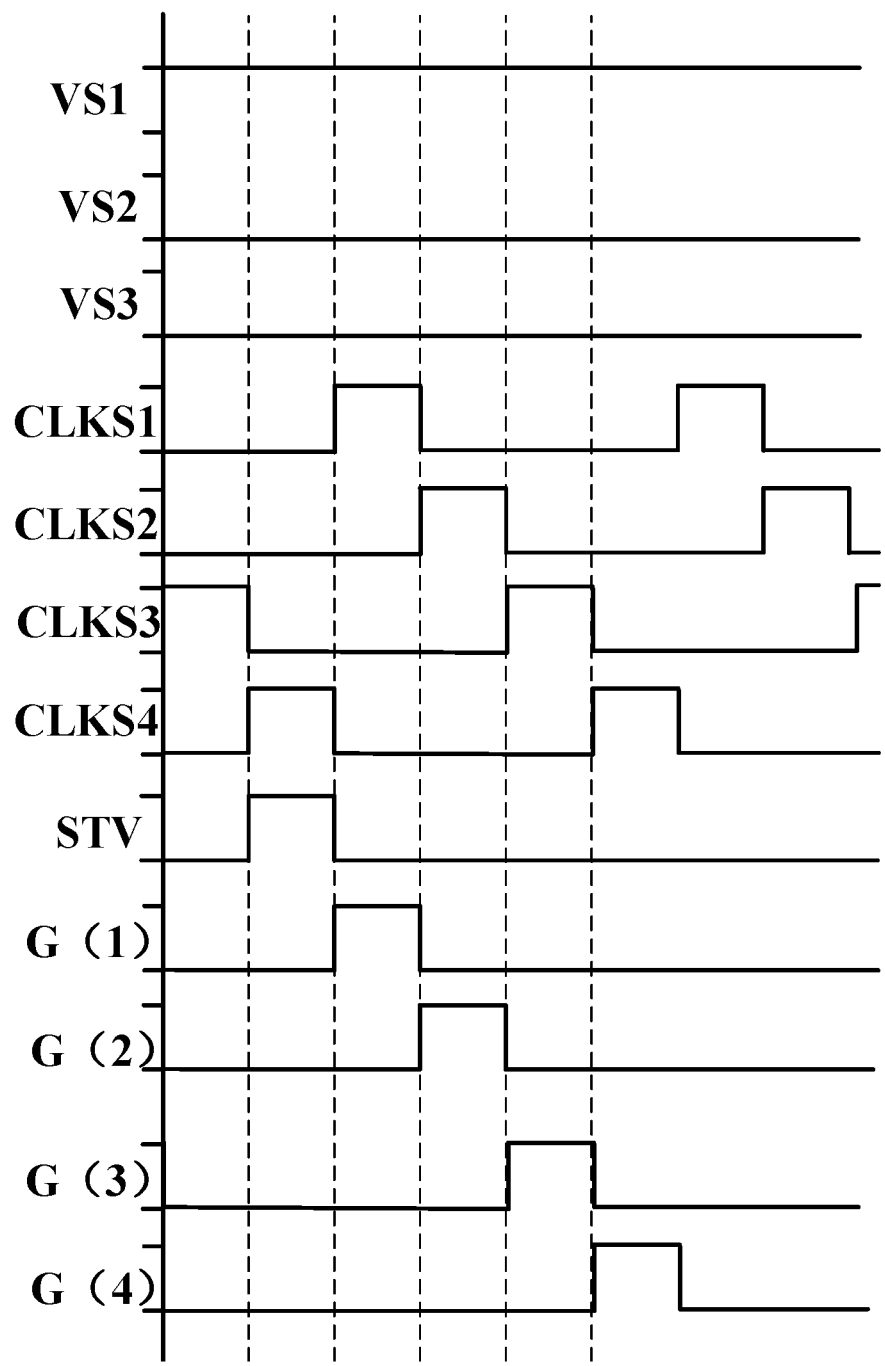
FIG. 8 is an exemplary operational timing diagram of the gate driving circuitry shown in FIG. 7.

FIG. 8 is an exemplary operational timing diagram of the gate driving circuitry shown in FIG. 7. A scan start signal STV is applied to the input signal terminal IP of a first-stage shift register circuitry GOA1 to start scanning, and the first-stage shift register circuitry GOA1 sequentially outputs a scanning signal G (1) for the first row of pixels, and a scanning signal G (2) for the second row of pixels. A second-stage shift register circuitry GOA2 sequentially outputs a scanning signal G (3) for the third row of pixels and a scanning signal G (4) for the fourth row of pixels.

Referring to FIG. 7 and FIG. 8, the voltage at the first voltage terminal V1, the second voltage terminal V2, and the third voltage terminal V3 of the shift register circuitry of each stage is a constant voltage. Thus, by way of example, the same set of voltage sources, namely, the first voltage source VS1, the second voltage source VS2, and the third voltage source VS3, may be used to supply power to all of the shift register circuitries.

In addition, in order to enable the scanning signals for the respective rows of pixels to be sequentially outputted, FIG. 7 and FIG. 8 exemplify the use of four clock signals with the same waveform, a phase difference of 90 degrees sequentially and the same duty ratio of 1:4, from four clock sources, namely, a first clock signal source CLKS1, a second clock signal source CLKS2, a third clock signal source CLKS3, and a fourth clock signal source CLKS4.

For the first-stage shift register circuitry GOA1, the first clock signal terminal CLK1 is coupled to the first clock signal source CLKS1, the second clock signal terminal CLK2 is coupled to the second clock signal source CLKS3, and the third clock signal terminal CLK3 is coupled to the third clock source CLKS3. That is, after the scan start signal STV is applied to the input signal terminal IP of the first-stage shift register circuitry GOA1, a valid voltage is sequentially applied to the first clock signal terminal CLK1, the second clock signal terminal CLK2 and the third clock signal terminal CLK3, and the first-stage shift register circuitry GOA1 operates to output the scanning signal G (1) for the first row of pixels and the scanning signal G (2) for the second row of pixels.

For the second-stage shift register circuitry GOA2, the first clock signal terminal CLK1 is coupled to the third clock signal source CLKS3, the second clock signal terminal CLK2 is coupled to the fourth clock signal source CLKS4, and the third clock signal terminal CLK3 is coupled to the first clock source CLKS1. That is, after the scanning signal G (2) for the second row of pixels is applied to the input signal terminal IP of the second-stage shift register circuitry GOA2, a valid voltage is sequentially applied to the first clock signal terminal CLK1, the second clock signal terminal CLK2 and the third clock signal terminal CLK3, and the second-stage shift register circuitry GOA2 operates to output a scanning signal G (3) for the third row of pixels and a scanning signal G (4) for the fourth row of pixels.

And so on, the manner of connecting odd-numbered-stage shift register circuitries with the clock sources is the same. The manner of connecting the even-numbered-stage shift register circuitries with the clock sources is the same. According to the example described above, it is possible to reduce the number of clock sources required.

According to the gate driving circuitry provided in embodiments of the present disclosure, scanning signals for two rows of pixels may be outputted by a single shift register circuitry, which may save circuit resources and reduce costs.

In embodiments of the present disclosure, there is provided a display substrate, including the gate driving circuitry described above.

In embodiments of the present disclosure, there is provided a display device, including the display substrate described above. The display device can be any product or component having a display function such as a cell phone, a tablet computer, a television, a display, a notebook computer, a digital photo frame, a navigator and the like.

According to the display substrate and the display device in the embodiments of the present disclosure, the circuit resources can be saved, the costs and the noise can be reduced, and the smoothness of the output can be improved.

It can be understood that the foregoing embodiments are merely exemplary embodiments used for illustrating the principle of the present disclosure, and the disclosure is not limited thereto. For those of ordinary skill in the art, various modifications and improvements may be made without departing from the spirit and essence of the present disclosure, and these modifications and improvements are also deemed to fall within the protection scope of the present disclosure.

What is claimed is:

1. A shift register circuitry, comprising an input circuit and a plurality of output circuits coupled to the input circuit;
   wherein the input circuit is coupled to an input signal terminal, and is configured to, under the control of a voltage at the input signal terminal, cause the plurality of output circuits to operate; and
   wherein each of the plurality of output circuits is coupled to a respective clock signal terminal and a respective output signal terminal, and is configured to operate to couple the respective clock signal terminal to the respective output signal terminal so as to output a driving signal at the respective output signal terminal;
   wherein the shift register circuitry at least further comprises a pull-down control circuit a first pull-down circuit, and a second pull-down circuit;
   wherein the plurality of output circuits comprise at least a first output circuit and a second output circuit;
   wherein the input circuit is coupled to the input signal terminal, a first voltage terminal, a first pull-up point, and a second pull-up point, and is configured to couple the first voltage terminal to the first pull-up point and the second pull-up point, under the control of the voltage at the input signal terminal;
   wherein the first output circuit is coupled to a first clock signal terminal and a first output signal terminal, and is configured to couple the first clock signal terminal to the first output signal terminal, under the control of a voltage at the first pull-up point;
   wherein the second output circuit is coupled to a second clock signal terminal and a second output signal terminal and is configured to couple the second clock signal terminal to the second output signal terminal, under the control of a voltage at the second pull-up point;
wherein the pull-down control circuit is coupled to a third voltage terminal, a third clock signal terminal, the first pull-up point, the second pull-up point, and a pull-down point, and is configured to selectively couple the pull-down point to one of the third voltage terminal and the third clock signal terminal, under the control of voltages at the third clock signal terminal, the first pull-up point and the second pull-up point;
wherein the first pull-down circuit is coupled to the pull-down point, the third voltage terminal, the first pull-up point, and the first output signal terminal, and is configured to couple the first pull-up point and the first output signal terminal to the third voltage terminal, under the control of a voltage at the pull-down point; and
wherein the second pull-down circuit is coupled to the pull-down point, the third voltage terminal, the second pull-up point, and the second output signal terminal, and is configured to couple the second pull-up point and the second output signal terminal to the third voltage terminal, under the control of the voltage at the pull-down point.

2. The shift register circuitry according to claim 1, further comprising a pull-up point isolation circuit;
wherein the pull-up point isolation circuit is coupled to the input circuit and the plurality of output circuits, and is configured such that a conductivity from the input circuit to the plurality of output circuits is unidirectional.

3. The shift register circuitry according to claim 1, wherein the shift register circuitry further comprises a reset circuit; and
wherein the reset circuit is coupled to a reset signal terminal, a second voltage terminal, and the input circuit, and is configured to couple the input circuit to the second voltage terminal, under the control of a voltage at the reset signal terminal.

4. The shift register circuitry according to claim 3, wherein the reset circuit comprises a ninth transistor, wherein a control electrode of the ninth transistor is coupled to the reset signal terminal, wherein a first electrode of the ninth transistor is coupled to the input circuit, and wherein a second electrode of the ninth transistor is coupled to the second voltage terminal.

5. The shift register circuitry according to claim 1, wherein the pull-up point isolation circuit is coupled to the input circuit, the first pull-up point, and the second pull-up point, and is configured such that a conductivity from the input circuit to the first pull-up point and a conductivity from the input circuit to the second pull-up point are unidirectional.

6. The shift register circuitry according to claim 5,
wherein the pull-up point isolation circuit comprises a first transistor and a second transistor,
wherein a control electrode and a first electrode of the first transistor are coupled to the input circuit, and a second electrode of the first transistor is coupled to the first pull-up point; and
wherein a control electrode and a first electrode of the second transistor are coupled to the input circuit, and a second electrode of the second transistor is coupled to the second pull-up point.

7. The shift register circuitry according to claim 1, wherein the pull-down control circuit is further coupled to the first output signal terminal and the second output signal terminal, and is configured to selectively couple the pull-down point to one of the third voltage terminal and the third clock signal terminal, under the control of voltages at the third clock signal terminal, the first pull-up point, the second pull-up point, the first output signal terminal, and the second output signal terminal.

8. The shift register circuitry according to claim 7, wherein the pull-down control circuit comprises a third transistor, a fourth transistor, a fifth transistor, a sixth transistor, and a seventh transistor;
wherein a control electrode and a first electrode of the third transistor are coupled to the third clock signal terminal, and a second electrode of the third transistor is coupled to the pull-down point;
wherein a control electrode of the fourth transistor is coupled to the first pull-up point, a first electrode of the fourth transistor is coupled to the pull-down point, and a second electrode of the fourth transistor is coupled to the third voltage terminal;
wherein a control electrode of the fifth transistor is coupled to the first output signal terminal, a first electrode of the fifth transistor is coupled to the pull-down point, and a second electrode of the fifth transistor is coupled to the third voltage terminal;
wherein a control electrode of the sixth transistor is coupled to the second pull-up point, a first electrode of the sixth transistor is coupled to the pull-down point, and a second electrode of the sixth transistor is coupled to the third voltage terminal; and
wherein a control electrode of the seventh transistor is coupled to the second output signal terminal, a first electrode of the seventh transistor is coupled to the pull-down point, and a second electrode of the seventh transistor is coupled to the third voltage terminal.

9. The shift register circuitry according to claim 1, wherein the input circuit comprises an eighth transistor, wherein a control electrode of the eighth transistor is coupled to the input signal terminal, wherein a first electrode of the eighth transistor is coupled to the first voltage terminal, and wherein a second electrode of the eighth transistor is coupled to the first pull-up point and the second pull-up point.

10. The shift register circuitry according to claim 1,
wherein the first output circuit comprises a tenth transistor and a first capacitor,
wherein a control electrode of the tenth transistor is coupled to the first pull-up point, a first electrode of the tenth transistor is coupled to the first clock signal terminal, and a second electrode of the tenth transistor is coupled to the first output signal terminal;
wherein the first capacitor is coupled between the control electrode and the second electrode of the tenth transistor;
wherein the second output circuit comprises an eleventh transistor and a second capacitor,
wherein a control electrode of the eleventh transistor is coupled to the second pull-up point, a first electrode of the eleventh transistor is coupled to the second clock signal terminal, and a second electrode of the eleventh transistor is coupled to the second output signal terminal; and
wherein the second capacitor is coupled between the control electrode and the second electrode of the eleventh transistor.

11. The shift register circuitry according to claim 1,
wherein the first pull-down circuit comprises a twelfth transistor, a thirteenth transistor, and a third capacitor,
wherein a control electrode of the twelfth transistor is connected to the pull-down point, a first electrode of the twelfth transistor is connected to the first pull-up point, and a second electrode of the twelfth transistor is connected to the third voltage terminal;
wherein a control electrode of the thirteenth transistor is connected to the pull-down point, a first electrode of the thirteenth transistor is connected to the first output signal terminal, and a second electrode of the thirteenth transistor is connected to the third voltage terminal;
wherein the third capacitor is coupled between the pull-down point and the third voltage terminal,
wherein the second pull-down circuit comprises a fourteenth transistor and a fifteenth transistor;
wherein a control electrode of the fourteenth transistor is connected to the pull-down point, a first electrode of the fourteenth transistor is connected to the second pull-up point, and a second electrode of the fourteenth transistor is connected to the third voltage terminal; and
wherein a control electrode of the fifteenth transistor is connected to the pull-down point, a first electrode of the fifteenth transistor is connected to the second output signal terminal, and a second electrode of the fifteenth transistor is connected to the third voltage terminal.

12. A driving method for driving a shift register circuitry according to claim 1, the method comprising:
applying a valid voltage to the input signal terminal, such that the plurality of output circuits are in operation; and
applying a valid voltage to the clock signal terminal, such that each of the plurality of output circuits outputs the driving signal.

13. The driving method of a shift register circuitry according to claim 12, wherein the shift register circuitry at least further comprises a pull-down control circuit, a first pull-down circuit, and a second pull-down circuit;
wherein the plurality of output circuits comprise at least a first output circuit and a second output circuit;
wherein the input circuit is coupled to the input signal terminal, a first voltage terminal, a first pull-up point, and a second pull-up point;
wherein the first output circuit is coupled to a first clock signal terminal and a first output signal terminal;
wherein the second output circuit is coupled to a second clock signal terminal and a second output signal terminal;
wherein the pull-down control circuit is coupled to a third voltage terminal, a third clock signal terminal, the first pull-up point, the second pull-up point, and a pull-down point;
wherein the first pull-down circuit is coupled to the pull-down point, the third voltage terminal, the first pull-up point, and the first output signal terminal;
wherein the second pull-down circuit is coupled to the pull-down point, the third voltage terminal, the second pull-up point, and the second output signal terminal;
wherein applying a valid voltage to an input signal terminal of the plurality of output circuits such that the plurality of output circuits are in operation comprises:
applying the valid voltage to the input signal terminal of the plurality of output circuits, and applying an invalid voltage to the first clock signal terminal, the second clock signal terminal, the third clock signal terminal, and a reset signal terminal, such that the input circuit couples the first voltage terminal to the first pull-up point and the second pull-up point, voltages at the first pull-up point and the second pull-up point are valid, the first output circuit couples the first clock signal terminal to the first output signal terminal, the first output signal terminal outputs an invalid voltage, the second output circuit couples the second clock signal terminal to the second output signal terminal, and the second output signal terminal outputs an invalid voltage;
wherein applying a valid voltage to the clock signal terminal such that each of the plurality of output circuits outputs a driving signal comprises:
applying a valid voltage to the first clock signal terminal, and applying an invalid voltage to the input signal terminal, the second clock signal terminal, the third clock signal terminal, and the reset signal terminal, such that voltages at the first pull-up point and the second pull-up point are valid, the first output circuit couples the first clock signal terminal to the first output signal terminal, the first output signal terminal outputs a valid voltage, the second output circuit couples the second clock signal terminal to the second output signal terminal, and the second output signal terminal outputs an invalid voltage;
applying a valid voltage to the second clock signal terminal, and applying an invalid voltage to the input signal terminal, the first clock signal terminal, the third clock signal terminal, and the reset signal terminal, such that voltages at the first pull-up point and the second pull-up point are valid, the first output circuit couples the first clock signal terminal to the first output signal terminal, the first output signal terminal outputs an invalid voltage, the second output circuit couples the second clock signal terminal to the second output signal terminal, and the second output signal terminal outputs a valid voltage.

14. The driving method of a shift register circuitry according to claim 13, wherein the shift register circuitry at least further comprises a reset circuit coupled to the reset signal terminal, the second voltage terminal, and the input circuit;
wherein the driving method of the shift register circuitry further comprises:
applying a valid voltage to the third clock signal terminal and the reset signal terminal, and applying an invalid voltage to the input signal terminal, the first clock signal terminal, and the second clock signal terminal, such that a voltage at the pull-down point is valid, the pull-down circuit couples the third voltage terminal to the first pull-up point, the second pull-up point, the first output signal terminal, and the second output signal terminal, the first output signal terminal outputs an invalid voltage, and the second output signal terminal outputs an invalid voltage.

15. A gate driving circuitry comprising a plurality of cascaded shift register circuitries according to claim 1, wherein one output signal terminal of a shift register circuitry of one stage is coupled to the input signal terminal of the shift register circuitry of the next stage.

16. The gate driving circuitry according to claim 15, wherein the shift register circuitry further comprises a pull-up point isolation circuit coupled to the input circuit and the plurality of output circuits, and configured such that a conductivity from the input circuit to the plurality of output circuits is unidirectional.

17. The gate driving circuitry according to claim 15, wherein the shift register circuitry at least further comprises a reset circuit, a pull-down control circuit, a first pull-down circuit, and a second pull-down circuit;

wherein the plurality of output circuits comprise at least a first output circuit and a second output circuit;

wherein the input circuit is coupled to an input signal terminal, a first voltage terminal, a first pull-up point, and a second pull-up point;

wherein the first output circuit is coupled to a first clock signal terminal and a first output signal terminal;

wherein the second output circuit is coupled to a second clock signal terminal and a second output signal terminal;

wherein the reset circuit is coupled to a reset signal terminal, a second voltage terminal, and the input circuit;

wherein the pull-down control circuit is coupled to a third voltage terminal, a third clock signal terminal, the first pull-up point, the second pull-up point, and the pull-down point;

wherein the first pull-down circuit is coupled to the pull-down point, the third voltage terminal, the first pull-up point, and the first output signal terminal;

wherein the second pull-down circuit is coupled to the pull-down point, the third voltage terminal, the second pull-up point, and the second output signal terminal; and wherein the second output signal terminal of the shift register circuitry of one stage is coupled to the input signal terminal of the shift register circuitry of the next stage, and the first output signal terminal of the shift register circuitry of one stage is coupled to the reset signal terminal of the shift register circuitry of the previous stage.

18. A display device, comprising the gate driving circuitry according to claim 15.

19. The display device according to claim 18, wherein the shift register circuit further comprises a pull-up point isolation circuit; and wherein the pull-up point isolation circuit is coupled to the input circuit and the plurality of output circuits, and is configured such that a conductivity from the input circuit to the plurality of output circuits is unidirectional.

* * * * *